(12) United States Patent
Karpov et al.

(10) Patent No.: US 7,894,237 B2
(45) Date of Patent: Feb. 22, 2011

(54) PROGRAMMING MULTILEVEL CELL PHASE CHANGE MEMORIES

(75) Inventors: Ilya V. Karpov, Santa Clara, CA (US); Semyon D. Savransky, Newark, CA (US)

(73) Assignee: Intel Corporation, Santa Clara, CA (US)

( * ) Notice: Subject to any disclaimer, the term of this patent is extended or adjusted under 35 U.S.C. 154(b) by 197 days.

(21) Appl. No.: 12/080,006

(22) Filed: Mar. 31, 2008

(65) Prior Publication Data
US 2009/0244963 A1    Oct. 1, 2009

(51) Int. Cl.
*G11C 11/00*    (2006.01)
(52) U.S. Cl. ............... 365/148; 365/100; 365/163; 365/185.19; 365/199
(58) Field of Classification Search ............. 365/148, 365/100, 163, 185.19, 199
See application file for complete search history.

(56) References Cited

U.S. PATENT DOCUMENTS

| | | | |
|---|---|---|---|
| 5,406,509 A | 4/1995 | Ovshinsky et al. | |
| 5,534,711 A | 7/1996 | Ovshinsky et al. | |
| 6,813,177 B2 | 11/2004 | Lowrey et al. | |
| 7,106,623 B2 | 9/2006 | Hung et al. | |
| 7,515,459 B2 * | 4/2009 | Kang et al. | 365/163 |
| 2008/0159019 A1 * | 7/2008 | Sutardja | 365/189.16 |
| 2009/0147565 A1 * | 6/2009 | Lowrey | 365/163 |
| 2009/0161415 A1 * | 6/2009 | Philipp et al. | 365/163 |

OTHER PUBLICATIONS

Resta et al., "Programming a Multilevel Phase Change Memory Cell", U.S. Appl. No. 11/904,306, filed Sep. 26, 2007.
Ovshinsky et al., "Innovation Providing New Multiple Functions in Phase-Change Materials to Achieve Cognitive Computing", Mt. Res. Soc. Symp. Proc., vol. 803, HH1.1.1-12, 2004.
Ovshinsky, "Ovonic Chalcogenide Non-Binary Electrical and Optical Devices", Proceedings of SPIE, vol. 5966, 7th International Symposium on Optical Storage, 2005.

* cited by examiner

*Primary Examiner*—Thong Q Le
(74) *Attorney, Agent, or Firm*—Trop, Pruner & Hu, P.C.

(57) ABSTRACT

A multilevel phase change memory cell may have a plurality of intermediate levels between a set and a reset or a crystalline and amorphous states. These intermediate levels between set and reset may be differentiated not only by programming current, but also by different programming pulse widths. As a result, the intermediate states may be positioned, on the programming current versus programming pulse width curve, in regions of common resistance with a relatively large range of programming current.

14 Claims, 3 Drawing Sheets

PROGRAMMING MULTILEVEL CELL PHASE CHANGE MEMORIES

BACKGROUND

This relates generally to phase change memories.

A phase change memory is a memory which includes a material that changes between amorphous and crystalline phases. Commonly, such memories include chalcogenide materials.

In some cases, phase change memory states may be detected by determining the threshold voltage of a cell including a phase change material. Depending on the phase of the material, the threshold voltage may change.

One example of a phase change memory that may rely on the threshold voltage of the phase change material is a so-called multilevel cell.

DETAILED DESCRIPTION

In accordance with some embodiments, a multilevel cell phase change memory may be programmed such that intermediate levels between the set (crystalline) and reset (amorphous) states may be determined, not just by different programming currents, but also by different pulse widths. By providing two degrees of freedom in setting the desired intermediate states, one can improve the performance of the phase change memory and can provide intermediate states with better margin.

In some embodiments, by analyzing the characteristics of a given phase change material in terms of resistance levels at different currents and pulse widths, one can position a given level or state in a region of a programming current versus pulse width curve with better margin. Thus, in some embodiments, intermediate states may be distinguished not only by different programming currents, but also through the use of different pulse widths within the same multilevel memory cell.

Figure 1:
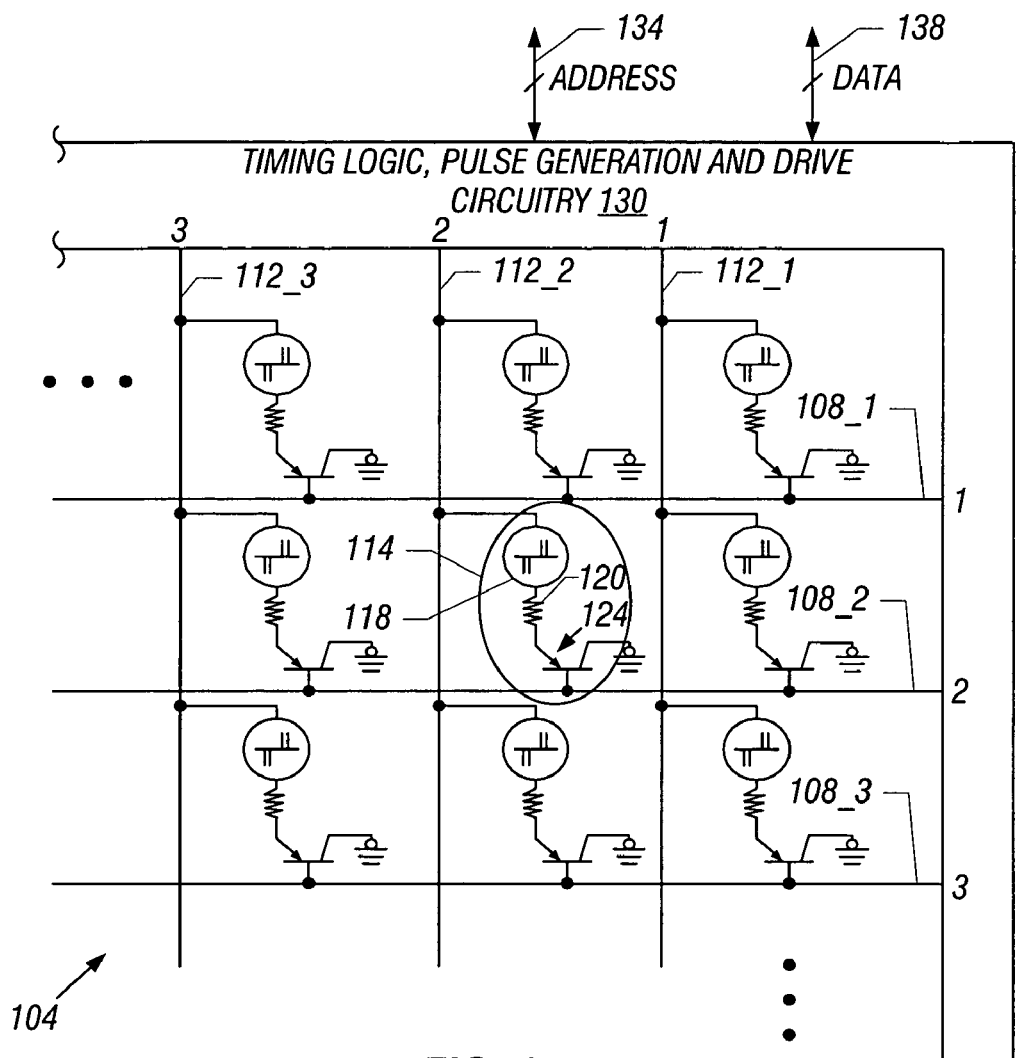
FIG. 1 is a circuit schematic for one embodiment of the present invention.

Referring now to FIG. 1, a phase change memory array 104 is controlled by timing logic, pulse generation and drive circuitry 130. The circuitry 130 is capable of performing programming and read operations on the array 104 according to the various embodiments described. Beginning first with the array 104, a number of vertically oriented conductive lines 112_1, 112_2, . . . , sometimes called bitlines, and a number of horizontally oriented conductive lines 108_1, 108_2, . . . , sometimes called wordlines, may be built on a semiconductor die in a cross-point matrix arrangement as shown. Each crossing of a bitline-wordline pair is associated with a separate memory cell 114. To achieve low manufacturing costs in large volumes, every memory cell 114 in the array 104 may be designed to have the same structure.

Each memory cell 114 has a volume of structural phase change material 118 that is coupled between a separate bitline-wordline pair of the conductive lines 112 and 108. The volume of phase change material 118 stores information for that cell according to its programmed resistivity or threshold voltage. Access to each cell 114 in the embodiment of FIG. 1 is via its corresponding conductive line pair and is made possible through additional circuitry in each cell, namely an isolation device 124 such as a parasitic PNP bipolar transistor, an ovonic threshold switch, or an MOS transistor. The horizontal conductive line for the selected cell, in this case line 108_2, is connected to the base of the transistor 124 while the vertical conductive line 112_2 for the cell 114 is connected to another side of the volume of phase change material 118. In this embodiment, the volume of phase change material 118 is in series with the emitter of the transistor 124, while the collector of the transistor 124 is connected to a power return node that may be common to all memory cells in the array 104 as well as the timing logic, pulse generation and drive circuitry 130. The transistor 124 connected as shown in FIG. 1 acts as a solid state switch under the control of a wordline signal received at its base. Other configurations for selectively blocking the cell current through the phase change material 118, such as using a discrete switching field effect transistor, are also possible. A resistor 120 may also be provided for heating and/or current limiting purposes in series with the volume of phase change material 118.

The cell current may be defined as a current through the volume of phase change material 118, and, in this embodiment, is also the bitline current. The cell current, in this embodiment, is equal to the emitter current of the device 124. The cell voltage, on the other hand, may be more loosely defined as any voltage relating to the cell 114 that includes the voltage across the volume of phase change material 118.

Still referring to FIG. 1, the timing logic, pulse generation and drive circuitry 130 has a number of input and output ports where each is coupled to a respective bitline 112 and wordline 108 of the array 104. These ports are driven with appropriate signal levels and timing so that one or more selected cells may be programmed and read as will be seen below. Conventional drive circuitry such as switching transistors may be used together with pulse generation circuitry that allows any desired waveshaping to be achieved on the signals that are driven into the bitlines and wordlines. The timing logic may also be implemented using conventional components including, for instance, counters to impart the needed timing for greater accuracy and speed in the programming and read operations. The timing logic may respond to input requests received via address lines 134 and data lines 138. Such requests may be to, for instance, write a single-bit or multi-bit data value to one or more cells in the array 104. Thus, the circuitry 130 is understood to include any necessary decoding logic to translate the address and data information received on the address and data lines into those bitline-wordline pairs of the array 104 that are to be driven and that correspond to the requested data and address. The circuitry 130 may be formed on the same die as the array 104.

Although the description herein refers to a single selected or target memory cell being programmed and read, the concepts are also applicable to simultaneously program and read from a number of memory cells simultaneously. For instance, depending upon the write request received by the circuitry 130, a number of memory cells that are in the same row of the array and are thus coupled to the same line 108, where each of these cells is coupled to a different line 112, may be programmed or read simultaneously.

When a cell 114 has been selected to be either programmed or read, one or more pulses may be applied to the conductive line pair of the selected cell. Thus, when the cell 114 shown in FIG. 1 is selected to be programmed or read, the potential on the line 112_2 is raised above that of the power return node while the potential on the line 108_2 is lowered (e.g. to that of the power return node) to provide base drive to the transistor 124. This, in turn, allows the emitter current to increase to the levels permitted by the pulse. The voltage and current levels that may be applied to the selected cell for programming and reading will depend on the current-voltage (i.e., I-V) characteristics of the cell.

Figure 2:
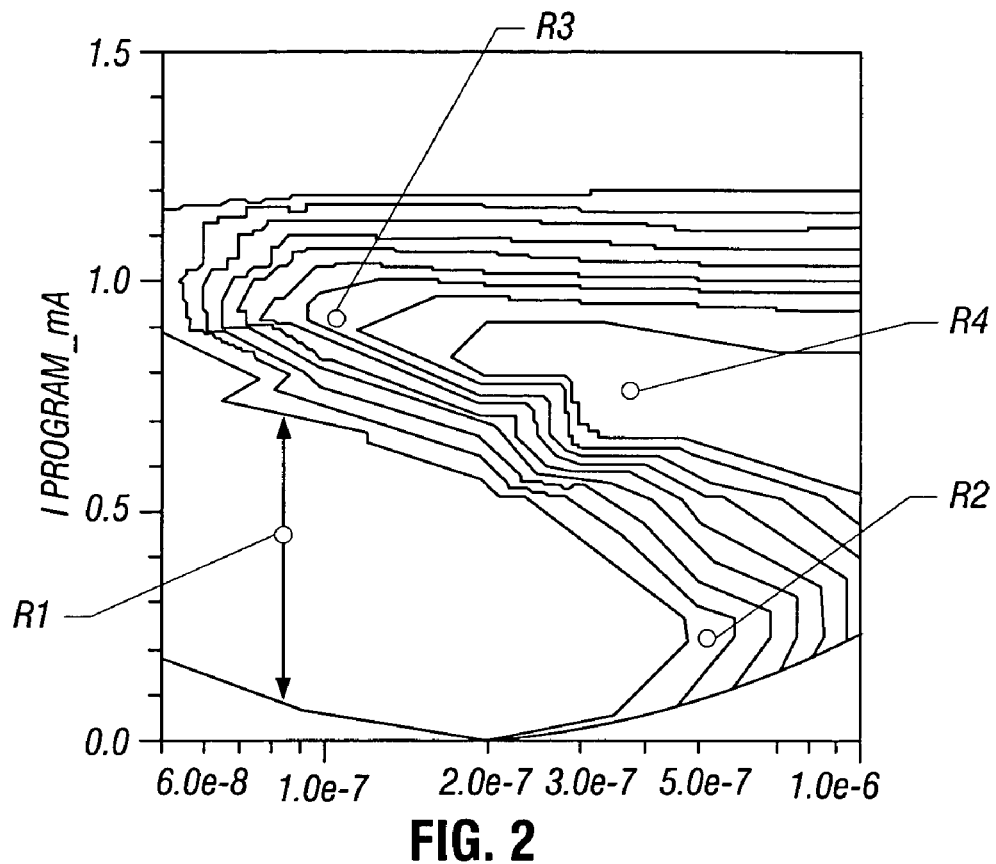
FIG. 2 is a plot of programming current versus programming pulse width for one embodiment of the present invention.

Referring to FIG. 2, a hypothetical contour plot or map of programming current versus programming pulse width is depicted with the contour lines indicating a resistance value, and the region between contours indicating a band of substantially the same resistance. The intermediate levels (R1-R4) are positioned so that each of the levels has a different programming current and at least some of the levels have different pulse widths. The use of different pulse widths enables the location of a level into a resistance region with better resistance margin. In effect, the level is placed only in a relatively wide area, indicated by the arrows, along the current axis of a band of a given resistance.

Thus, in the figure, there are more than four resistance bands, but resistance bands with relatively wide regions along the current axis may be chosen for the programmed levels and areas within those bands are selected where there is relatively greater extent along the current axis. The location of the specific level may then be chosen by selecting an appropriate pulse width along the horizontal axis to position the location of the level as ideally as possible.

In effect then, the pulse width may be selected to significantly decrease sensitivity of the resistance level on the programming current amplitude.

Figure 3:
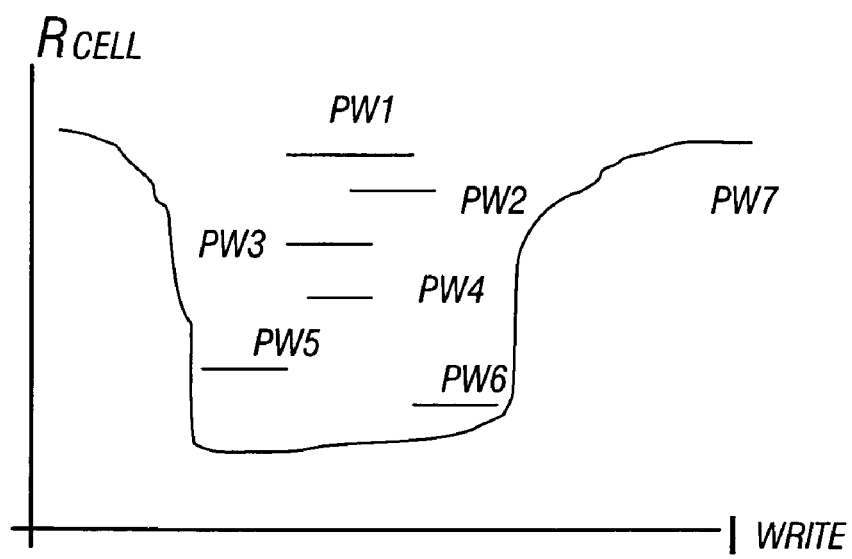
FIG. 3 is a plot of cell resistance versus write current in accordance with one embodiment of the present invention.

Referring to FIG. 3, a step-like cell resistance levels, labeled PW1-P6, versus write current curve is depicted over a conventional resistance current curve labeled PW7. FIG. 3 demonstrates that weaker sensitivity of multilevel cell resistance to programming current may be achieved when programming pulse width is specifically tailored to position the programmed level in a wide resistance band on the resistance versus current pulse width graph shown in FIG. 2.

Figure 4:
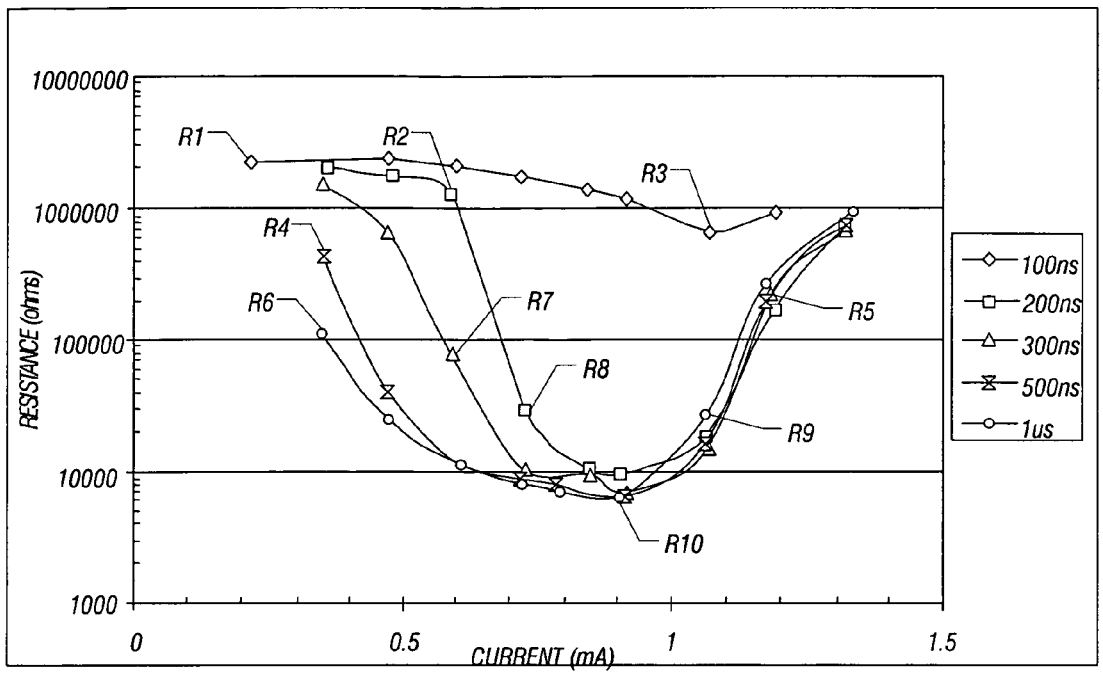
FIG. 4 is a plot of cell resistance versus programming current for one embodiment of the present invention.

Referring to FIG. 4, intermediate states with resistances R1, R2, R3, R4, R5 ... R1, ... Rn, between a maximum reset value resistance and a minimum set value resistance, can be achieved with square pulses with different pulse widths. Note the different levels of R2 and R7, in FIG. 4, can be achieved by pulses with the same amplitude (about 0.6 milliamps), but different pulse widths (200 nanoseconds versus 300 nanoseconds). Also, note that different levels of resistance R5 and R9 can be achieved by write current pulses with the same pulse width (1 microsecond), but different amplitudes (1.04 milliamps versus 1.2 milliamps).

Figure 5:
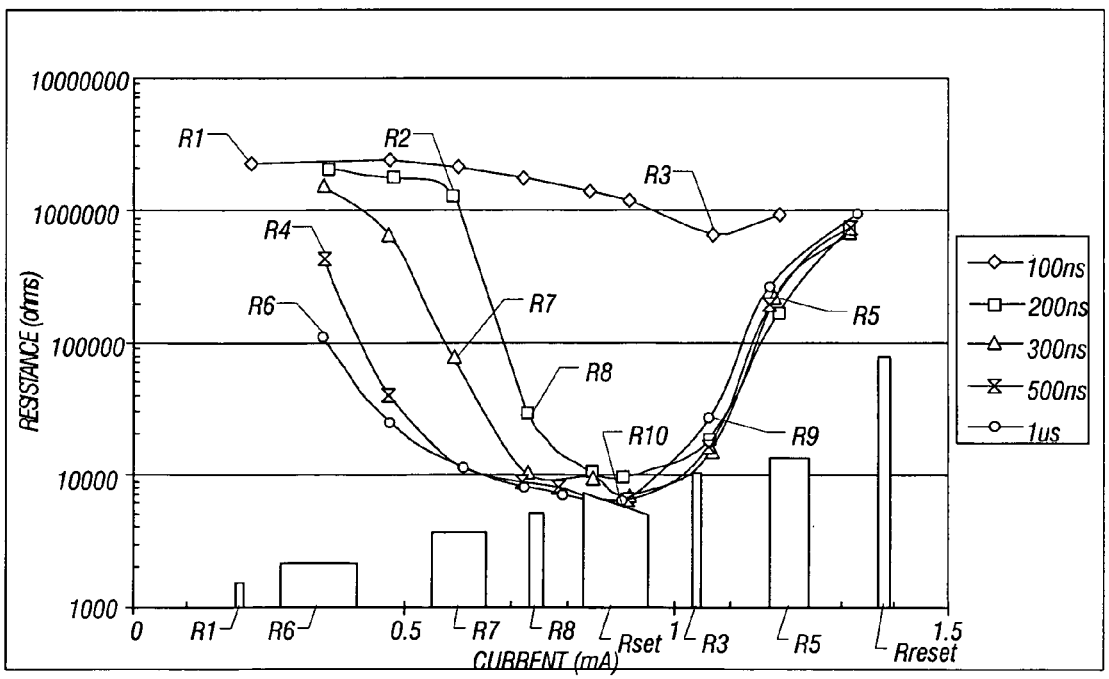
FIG. 5 is a plot of cell resistance versus programming current for one embodiment of the present invention showing different programming pulse characteristics.

Referring to FIG. 5, write pulses with variable pulse widths and amplitudes may be used in some embodiments. The pulses for R1 and R3 have the pulse width equal to the same value (100 nanoseconds), but different write currents. R1 is the result of a current of 200 micro-amps and R3 is achieved by a current of 1040 micro-amps. Thus, intermediate resistance states for multilevel cell programming can be placed, in some embodiments, at various points on the resistance versus programming current curve, or only on the left part of the curve, or only on the right part of the curve, as desired.

In FIG. 5, a variety of different pulse widths, pulse amplitudes, and even different pulse shapes may be utilized. Square pulses are used for R1, R6, R7, R8, R3, R5, and $R_{reset}$ and trapezoidal pulses are used in the case of $R_{set}$, the set resistance.

In some embodiments, the placement of the cell resistance within specified ranges is less dependent on within array dispersion of melt current and saturation current. There can be an increased number of resistance levels to store more bits per cell in some embodiments.

Figure 6:
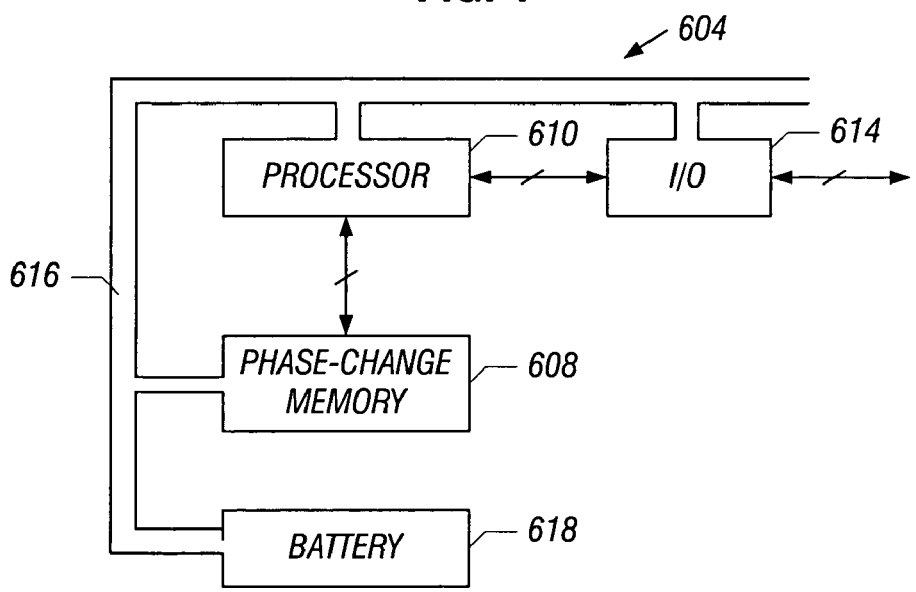
FIG. 6 is a system depiction for one embodiment.

Turning now to FIG. 6, what is shown is a block diagram of a portable electronic application 604 that embodies a phase change memory storage subsystem 608 having the capability of performing a read operation as has been described above. The storage system 608 may be operated according to an embodiment of the read process described above. The storage system 608 may include one or more integrated circuit dies, where each die has a memory array that is programmed and read according to the embodiments described above. These dice may be separate, stand alone memory devices that are arranged in modules such as conventional dynamic random access memory (DRAM) modules, or they may be integrated with other on-chip functionalities such as part of an I/O processor or a microcontroller.

The application 604 may be for instance a portable notebook computer, a digital still and/or video camera, a personal digital assistant, or a mobile (cellular) hand-held telephone unit. In all of these applications, a processor 610 and the storage system 608 used as program memory to store code and data for execution by the processor have been operatively installed on the board. The portable application 604 communicates with other devices, such as a personal computer or a network of computers, via an I/O interface 614. This I/O interface 614 may provide access to a computer peripheral bus, a high speed digital communication transmission line, or an antenna for unguided transmissions. Communications between the processor and the storage system 608 and between the processor and the I/O interface 614 may be accomplished using conventional computer bus architectures.

The above-described components of the portable application 604 are powered by a battery 618 via a power supply bus 616. Since the application 604 is normally battery powered, its functional components including the storage system 608 should be designed to provide the desired performance at low power consumption levels. In addition, due to the restricted size of portable applications, the components shown in FIG. 6 should provide a relatively high density of functionality. Of course, there are non-portable applications for the storage system 608 that are not shown. These include, for instance, large network servers or other computing devices which may benefit from a non-volatile memory device such as the phase change memory.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
using a first pulse width and a first programming current level to program a first level of a multilevel phase change memory cell; and
programming said cell to a second level using both of a different pulse width and a different programming current.

2. The method of claim 1 including using different programming currents and different pulse widths to program a multilevel cell.

3. The method of claim 1 including selecting a resistance band for a particular level of a multilevel cell.

4. The method of claim 2 including selecting resistance band with a larger range of programming current.

5. A phase change memory comprising:
an array of multilevel phase change memory cells, one of said cells including an ovonic unified memory and an ovonic threshold switch; and
a controller to program a cell using different pulse widths.

6. The memory of claim 5 including using different programming currents to program one of said cells.

7. The memory of claim 5, one of said cells including at least two levels, said controller to use different pulse widths to program the two levels.

8. The memory of claim 5, said controller to apply current pulses to program one of said cells.

9. The memory of claim 5, said controller to program at least three different levels by changing the pulse width of a programming pulse.

10. The system of claim 7, said controller to program at least three different levels by changing the pulse width of a programming pulse.

11. A system comprising:
a processor; and
a multilevel phase change memory programmable using a first pulse width in a first programming current level to program a first level of a multilevel phase change memory cell and to program a second level using both of a different pulse width and a different programming current.

12. The system of claim 11 wherein said cell is programmable using different current amplitudes.

13. The system of claim 11, said memory including a controller.

14. The system of claim 13, said cell having at least two levels, said controller to use different pulse widths to program the two levels.

* * * * *